(12) United States Patent
Ting

(10) Patent No.: US 7,405,429 B2
(45) Date of Patent: Jul. 29, 2008

(54) PIXEL STRUCTURE

(75) Inventor: Chin-Kuo Ting, Taoyuan (TW)

(73) Assignee: AU Optronics Corp. (AUO), Hsinchu (TW)

( * ) Notice: Subject to any disclaimer, the term of this patent is extended or adjusted under 35 U.S.C. 154(b) by 89 days.

(21) Appl. No.: 11/464,070

(22) Filed: Aug. 11, 2006

(65) Prior Publication Data

US 2007/0190701 A1     Aug. 16, 2007

(30) Foreign Application Priority Data

Feb. 16, 2006   (TW) .............................. 95105190 A

(51) Int. Cl.
*H01L 29/00* (2006.01)

(52) U.S. Cl. .......................................... 257/72; 257/59

(58) Field of Classification Search .................. 257/72, 257/350, E27.131, E27.132, E27.141, 59
See application file for complete search history.

(56) References Cited

U.S. PATENT DOCUMENTS

| 6,960,786 | B2* | 11/2005 | Yamazaki et al. | 257/59 |
| 7,129,524 | B2* | 10/2006 | Lee | 257/59 |
| 7,244,962 | B2* | 7/2007 | Nakajima et al. | 257/57 |
| 2004/0262610 | A1* | 12/2004 | Nam | 257/72 |
| 2005/0116232 | A1* | 6/2005 | Kim et al. | 257/72 |
| 2005/0285114 | A1* | 12/2005 | Kang et al. | 257/72 |
| 2006/0049407 | A1* | 3/2006 | Jung et al. | 257/72 |
| 2007/0001945 | A1* | 1/2007 | Yoshida et al. | 345/87 |
| 2007/0090357 | A1* | 4/2007 | Tsou et al. | 257/57 |
| 2007/0138479 | A1* | 6/2007 | Yamazaki et al. | 257/72 |
| 2007/0164290 | A1* | 7/2007 | Yamazaki et al. | 257/72 |
| 2007/0200139 | A1* | 8/2007 | Shibata et al. | 257/146 |
| 2007/0229722 | A1* | 10/2007 | Liu | 349/43 |
| 2007/0236625 | A1* | 10/2007 | Wang et al. | 349/54 |

* cited by examiner

*Primary Examiner*—Thao P. Le
(74) *Attorney, Agent, or Firm*—J.C. Patents

(57) ABSTRACT

A method of fabricating a thin film transistor is disclosed. First, a substrate is provided and a patterned polysilicon layer is formed on the substrate. A metal layer is formed on the patterned polysilicon layer. Then, a portion of the metal layer is removed so that the remaining metal layer beside the patterned polysilicon layer forms a source and a drain. A gate insulation layer is formed on the substrate to cover the source, the drain and the patterned polysilicon layer. A gate is formed on the gate insulation layer over the patterned polysilicon layer.

4 Claims, 11 Drawing Sheets

PIXEL STRUCTURE

CROSS-REFERENCE TO RELATED APPLICATION

This application claims the priority benefit of Taiwan application serial no. 95105190, filed on Feb. 16, 2006. All disclosure of the Taiwan application is incorporated herein by reference.

BACKGROUND OF THE INVENTION

1. Field of the Invention

The present invention relates to a pixel structure and thin film transistor and fabrication method thereof. More particularly, the present invention relates to a thin film transistor with a source and a drain made of metallic material and a pixel structure having the thin film transistor and the fabrication method thereof.

2. Description of Related Art

The rapid development of multi-media in our society comes as a result of the many advances in the technology for manufacturing semiconductor and display devices. For display device, thin film transistor liquid crystal display (TFT-LCD), with its high display quality, high spatial utilization, low power consumption and radiation-free operation, has gradually become one of the mainstream products in the market. In fact, thin film transistors have been commonly used inside the thin film transistor liquid crystal display.

FIG. 1 is a schematic cross-sectional view of a conventional thin film transistor. As shown in FIG. 1, the conventional thin film transistor 100 includes a substrate 110, a channel layer 120, a source 130, a first metal contact layer 130a, a drain 140, a second metal contact layer 140a, a gate insulation layer 150, a first dielectric layer 152 and a gate 160. The channel layer 120 is disposed on the substrate 110 and the source 130 and the drain 140 are disposed on the respective sides of the channel layer 120. The gate insulation layer 150 covers the channel layer 120, the source 130 and the drain 140. The gate 160 is located on the gate insulation layer 150 above the channel layer 120. The first dielectric layer 152 covers the gate insulation layer 150 and the gate 160. Furthermore, the first metal contact layer 130a and the second metal contact layer 140a are electrically connected to the source 130 and the drain 140 via the contact opening P1 and P2 respectively.

Conventionally, the channel layer 120, the source 130 and the drain 140 are fabricated using the following steps. First, a polysilicon layer (not shown) is formed over the substrate 110. After forming a gate 160 on the polysilicon layer, an ion implantation is carried out using the gate 160 as a mask to form the source 130 and the drain 140 in the polysilicon layer. Because the source 130 and the drain 140 are formed in an ion implantation, the production requires a longer time and a higher cost. Moreover, the source 130 and the drain 140 made of polysilicon material, and the first metal contact layer 130a and the second metal contact layer 140a for electrically connecting with the source 130 and the drain 140 are made of a different material. As a result, the contact resistance between the source 130 and the first metal contact layer 130a and the contact resistance between the drain 140 and the second metal contact layer 140a are high. When the dimension of the liquid crystal display panel increases in the future, the foregoing high contact resistance will cause more resistance-capacitance delay in signal transmission. Ultimately, the display quality of the liquid crystal display panel will be compromised.

SUMMARY OF THE INVENTION

Accordingly, at least one objective of the present invention is to provide a thin film transistor with a source and a drain made of metallic material so that the contact resistance between the source and a first metal contact layer and the contact resistance between the drain and a second metal contact layer are reduced.

At least a second objective of the present invention is to provide a method of fabricating a thin film transistor capable of producing a thin film transistor with a source and a drain made of metallic material.

At least a third objective of the present invention is to provide a pixel structure having the foregoing thin film transistor.

At least a fourth objective of the present invention is to provide a method of fabricating a pixel structure capable of shortening production time and lowering production cost.

To achieve these and other advantages and in accordance with the purpose of the invention, as embodied and broadly described herein, the invention provides a method of fabricating a thin film transistor. The method includes the following steps. First, a substrate is provided and a patterned polysilicon layer is formed on the substrate. Then, a metal layer is formed over the patterned polysilicon layer and the substrate. Thereafter, a portion of the metal layer is removed so that the remaining metal layer beside the patterned polysilicon layer forms a source and a drain. A gate insulation layer is formed over the substrate to cover the source, the drain and the patterned polysilicon layer. A gate is formed on the gate insulation layer above the patterned polysilicon layer. A first dielectric layer is formed over the substrate to cover the gate and the gate insulation layer. After that, a first contact opening and a second contact opening are formed in the first dielectric layer and the gate insulation layer respectively so that the source and the drain are exposed. Then, a first metal contact layer and a second contact layer are formed on the first dielectric layer. The first metal contact layer and the second metal contact layer fill the first contact opening and the second contact opening and electrically connect with the source and the drain respectively.

According to one embodiment of the present invention, the method of fabricating a thin film transistor further includes forming a doped protective wall between the patterned polysilicon layer and the source and drain.

According to one embodiment of the present invention, the step of removing a portion of the metal layer to retain only a portion of the metal layer beside the patterned polysilicon includes performing a photolithographic process and an etching process.

According to one embodiment of the present invention, the step of removing a portion of the metal layer to retain only a portion of the metal layer beside the patterned polysilicon includes performing a chemical-mechanical polishing process and then performing a photolithographic process and an etching process.

According to one embodiment of the present invention, the metal layer is fabricated using aluminum, copper, chromium, silver or molybdenum, for example.

The present invention also provides a method of fabricating a pixel structure. The method includes the following steps. First, a substrate is provided and a patterned polysilicon layer is formed on the substrate. Then, a metal layer is formed over the patterned polysilicon layer and the metal layer. A portion of the metal layer is removed while retaining a portion of the metal layer beside the patterned polysilicon layer to form a source, a drain and a data line electrically connected to the source. A gate insulation layer is formed over the substrate to cover the data line, the source, the drain and the patterned polysilicon layer. Then, a gate is formed on the gate insulation layer over the patterned polysilicon layer and a scan line electrically connected to the gate is also formed. A first dielectric layer is formed over the substrate to cover the gate insulation layer, the gate and the scan line. Thereafter, a contact opening is formed in the first dielectric layer and the gate insulation layer to expose the drain. A pixel electrode is formed on the first dielectric layer such that the pixel electrode fills the contact opening and electrically connects with the drain.

The present invention also provides an alternative method of fabricating a pixel structure. The method includes the following steps. First, a substrate is provided and a patterned polysilicon layer is formed on the substrate. Then, a metal layer is formed over the patterned polysilicon layer and the metal layer. A portion of the metal layer is removed while retaining a portion of the metal layer beside the patterned polysilicon layer to form a source, a drain and a data line electrically connected to the source. A gate insulation layer is formed over the substrate to cover the data line, the source, the drain and the patterned polysilicon layer. Then, a gate is formed on the gate insulation layer over the patterned polysilicon layer. A scan line electrically connected to the gate is also formed. A first dielectric layer is formed over the substrate to cover the gate insulation layer, the gate and the scan line. Thereafter, a first contact opening and a second contact opening are formed in the first dielectric layer and the gate insulation layer to expose the source and the drain respectively. A first metal contact layer and a second metal contact layer are formed over the first dielectric layer. The first metal contact layer and the second metal contact layer fill the first contact opening and the second contact opening and electrically connect with the source and the drain respectively. After that, a second dielectric layer is formed over the first dielectric layer to cover the first metal contact layer and the second metal contact layer. A third contact opening is formed in the second dielectric layer. The third contact opening exposes the second metal contact layer. Finally, a pixel electrode is formed on the second dielectric layer. The pixel electrode fills the third contact opening to connect electrically with the second metal contact layer.

According to one embodiment of the present invention, the method of fabricating the pixel structure further includes forming a doped protective wall between the patterned polysilicon layer and the source and drain.

According to one embodiment of the present invention, the step of removing a portion of the metal layer to retain only a portion of the metal layer beside the patterned polysilicon includes performing a photolithographic process and an etching process.

According to one embodiment of the present invention, the step of removing a portion of the metal layer to retain only a portion of the metal layer beside the patterned polysilicon includes performing a chemical-mechanical polishing process and then performing a photolithographic process and an etching process.

The present invention also provides a thin film transistor comprising a patterned polysilicon layer, a source, a drain, a gate insulation layer, a gate, a first dielectric layer, a first contact, a second contact, a first metal contact layer and a second contact layer. The patterned polysilicon layer is disposed on a substrate, and the source and the drain are disposed on the respective sides of the patterned polysilicon layer. The source and the drain are made of metallic material. The gate insulation layer covers the source, the drain and the patterned polysilicon layer. The gate is disposed on the gate insulation layer over the patterned polysilicon layer. The first dielectric layer covers the gate and the gate insulation layer. The first contact and the second contact are located in the first dielectric layer. The first metal contact layer and the second contact layer are disposed on the first dielectric layer and are electrically connected to the source and the drain through the first contact and the second contact respectively.

According to one embodiment of the present invention, the thin film transistor further includes a doped protective wall disposed between the patterned polysilicon layer and the source and drain.

According to one embodiment of the present invention, the source and the drain in the thin film transistor are fabricated using aluminum, copper, chromium, silver or molybdenum, for example.

The present invention also provides a pixel structure comprising a patterned polysilicon layer, a source, a drain, a data line, a gate insulation layer, a gate, a scan line, a first dielectric layer, a contact opening and a pixel electrode. The patterned polysilicon layer is disposed on a substrate. The source and the drain are disposed on the respective sides of the patterned polysilicon layer. Furthermore, the source and the drain are made of metallic material. The data line is electrically connected to the source. The gate insulation layer is disposed to cover the data line, the source, the drain and the patterned polysilicon layer. The gate is disposed on the gate insulation layer above the patterned polysilicon layer. The scan line and the gate are electrically connected. The first dielectric layer covers the gate insulation layer, the gate and the scan line. The contact opening is disposed in the first dielectric layer and the gate insulation layer to expose the drain. The pixel electrode in the present invention is disposed on the first dielectric layer. Furthermore, the pixel electrode fills the contact opening and electrically connects with the drain.

The present invention also provides an alternative pixel structure comprising a patterned polysilicon layer, a source, a drain, a gate insulation layer, a gate, a scan line, a first dielectric layer, a first contact opening, a second contact opening, a third contact opening, a first metal contact layer, a second metal contact layer, a data line, a second dielectric layer, a contact opening and a pixel electrode. The patterned polysilicon layer is disposed on a substrate. The source and the drain are disposed on the respective sides of the patterned polysilicon layer. Furthermore, the source and the drain are made of metallic material. The gate insulation layer covers the source, the drain and the patterned polysilicon layer. The gate is disposed on the gate insulation layer over the patterned polysilicon layer. The scan line and the gate are electrically connected. The first dielectric layer is disposed over the gate and the scan line. The first contact opening and the second contact opening are disposed in the first dielectric layer and the gate insulation layer to expose the source and the drain respectively. The first metal contact layer and the second metal contact layer are disposed on the first dielectric layer, located inside the first contact opening and the second contact opening and electrically connected to the source and the drain respectively. The data line in the present invention is electrically connected to the source. The second dielectric layer is disposed on the first dielectric layer to cover the first metal contact layer and the second metal contact layer. The third contact opening is disposed in the second dielectric layer to expose the second metal contact layer. In addition, the pixel electrode is disposed on the second dielectric layer, located inside the third contact opening and electrically connected to the second metal contact layer.

According to one embodiment of the present invention, the pixel structure further includes a doped protective wall disposed between the patterned polysilicon layer and the source and drain.

Accordingly, the present invention uses a metallic material to form the source and the drain of the thin film transistor, thereby reducing the contact resistance between the source and the first metal contact layer on one hand and between the drain and the second metal contact layer on the other.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
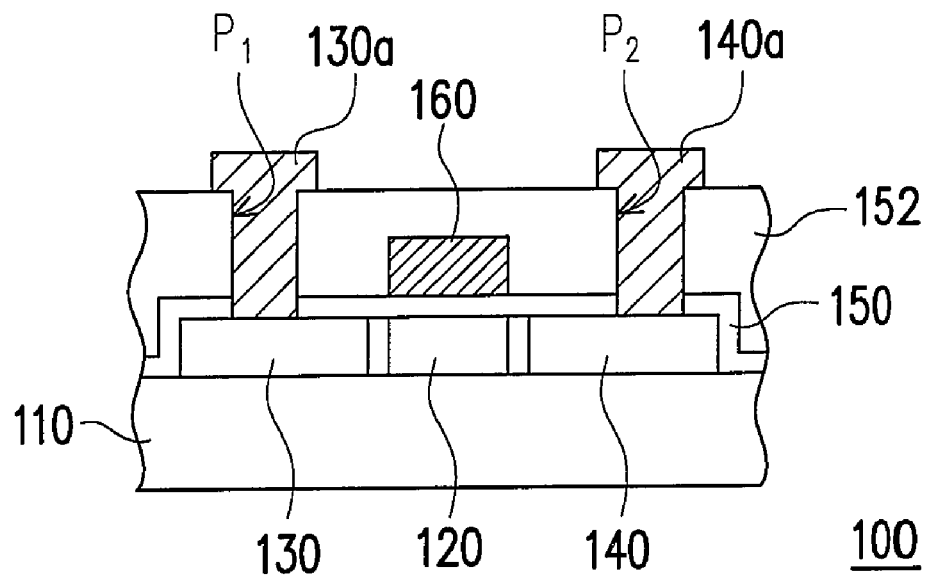
FIG. 1 is a schematic cross-sectional view of a conventional thin film transistor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
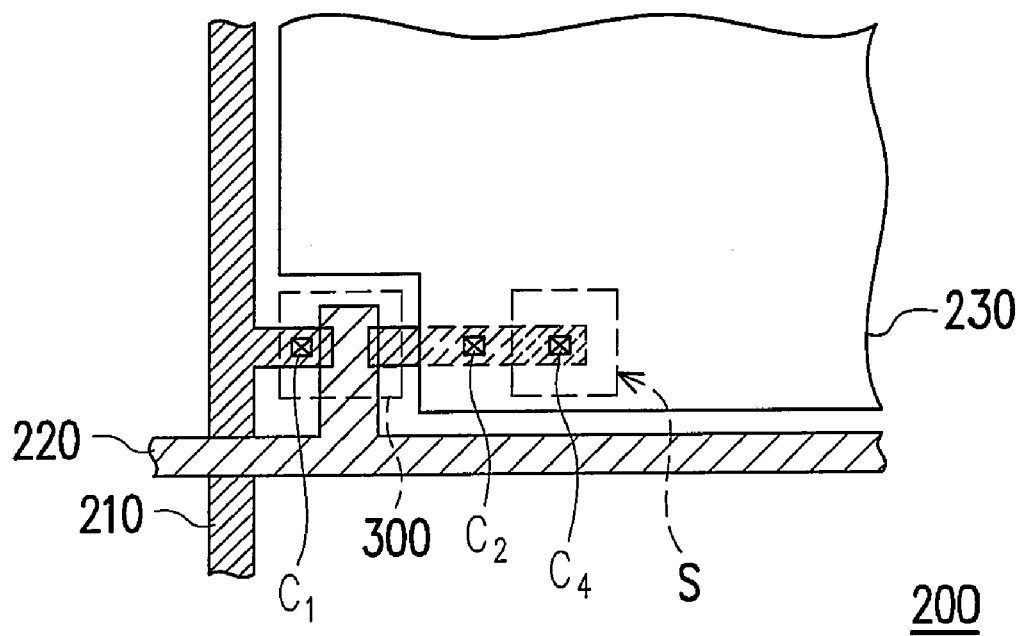
FIG. 2 is a top view of a pixel structure according to the first embodiment of the present invention.

FIG. 2 is a top view of a pixel structure according to a first embodiment of the present invention. As shown in FIG. 2, the pixel structure 200 mainly comprises a data line 210, a scan line 220, a pixel electrode 230, a thin film transistor 300 and a storage capacitor S. The data line 210 and the scan line 220 can transmit a signal to a corresponding pixel structure 200 and store the signal in the storage capacitor S ready for display. In the following, the method of fabricating the thin film transistor 300 and its internal structure are described. Then, the way to apply the thin film transistor structure and fabrication method thereof in the manufacturing of the pixel structure 200 is also described.

Figure 3A:
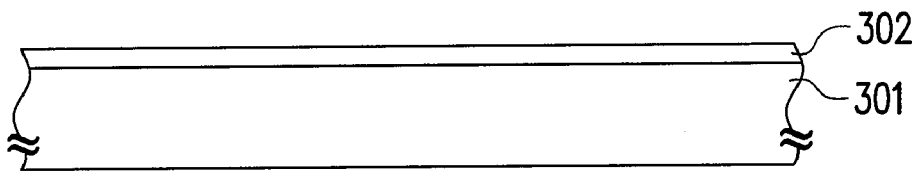
FIGS. 3A through 3L are schematic cross-sectional views showing the steps for producing a pixel structure according to the first embodiment of the present invention.
Figure 3B:
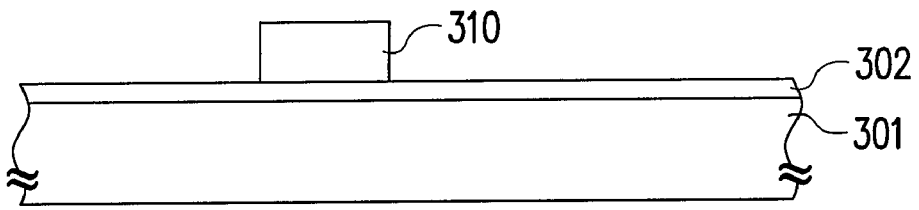

FIGS. 3A through 3L are schematic cross-sectional views showing the steps for producing a pixel structure according to the first embodiment of the present invention. As shown in FIGS. 3A and 3B, a substrate 301 is provided. In one preferred embodiment, a buffer layer 302 is formed on the surface of the substrate 300. The buffer layer 302 is a silicon oxide layer or a silicon nitride layer, for example. Then, a patterned polysilicon layer 310 is formed on the substrate 301. The method of forming the patterned polysilicon layer 310 includes depositing an amorphous silicon layer and performing a laser annealing process to initiate a re-crystallization of the amorphous silicon layer so as to form a polysilicon layer. Thereafter, the polysilicon layer is patterned to form the patterned polysilicon layer 310.

Figure 3C:
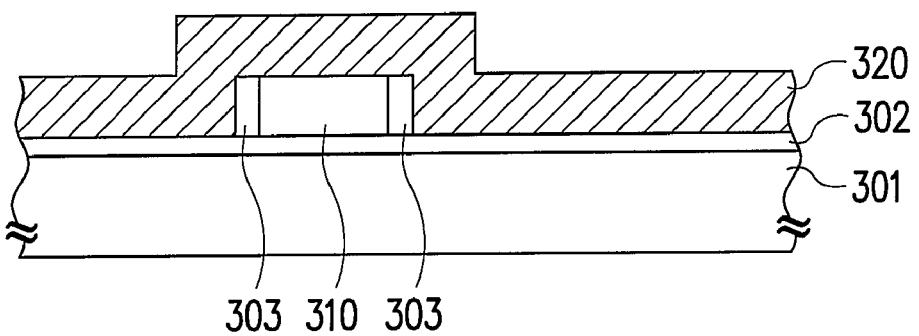

As shown in FIG. 3C, a metal layer 320 is formed over the patterned polysilicon layer 310 and the substrate 301. In one preferred embodiment, a doped protective wall 303 is formed on the sidewalls of the patterned polysilicon layer 310 before forming the metal layer 320. The doped protective wall 303 can lower the contact resistance between the polysilicon layer 310 and the metal layer 320. The method of forming the doped protective wall 303 includes depositing an N-doped or P-doped semiconductor material (not shown) to cover the patterned polysilicon layer 310 and the buffer layer 302, and then performing a dry etching process to the N-doped or P-doped semiconductor material.

Figure 3D:
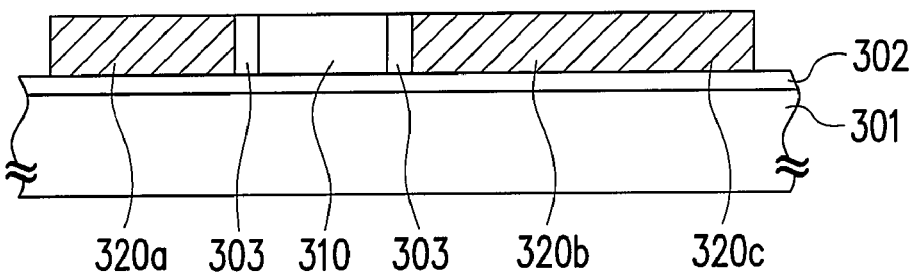

As shown in FIG. 3D, a portion of the metal layer 320 is removed but retaining part of the metal layer 320 on the respective sides of the patterned polysilicon layer 310 to form a source 320a, a drain 320b and a lower electrode layer 320c. In the process of forming the source 320a and the drain 320b, a data line 210 that connects electrically with the source 320a is simultaneously defined as shown in FIG. 2.

Here, the source 320a, the drain 320b and the lower electrode 320c are fabricated using a metallic material, for example, aluminum, copper, chromium, silver or molybdenum. The drain 320b and the lower electrode layer 320c are electrically connected together. In the following, two examples for removing a portion of the metal layer 320 are described. It should be noted that the source 320a and the drain 320b both made of metallic material are electrically connected to a subsequently formed first metal contact layer and second metal contact layer respectively. Therefore, the contact resistance between the source 320a and the subsequently formed first metal contact layer and the contact resistance between the drain 320b and the subsequently formed second metal contact layer can be effectively reduced.

Moreover, the process of forming the source 320a and the drain 320b in the present invention does not need to use an ion implanting machine or an annealing process. Therefore, the method in the present invention can effectively shorten the production time and reduce the production cost.

Figure 4A:
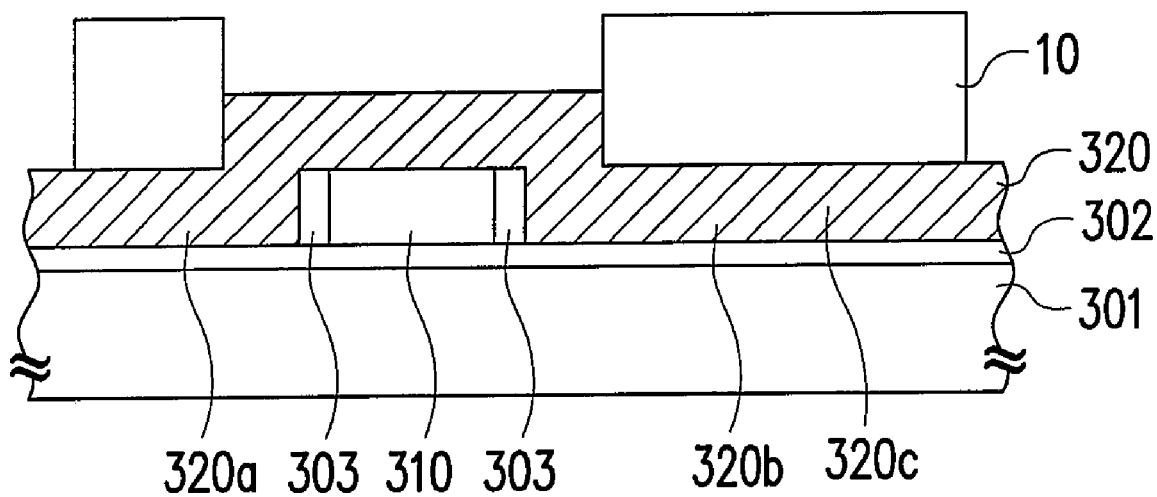
FIGS. 4A and 4B are schematic cross-sectional views showing the steps for removing a portion of a metal layer but retaining a portion of the metal layer on the respective sides of the patterned polysilicon layer according to the first embodiment of the present invention.
Figure 4B:
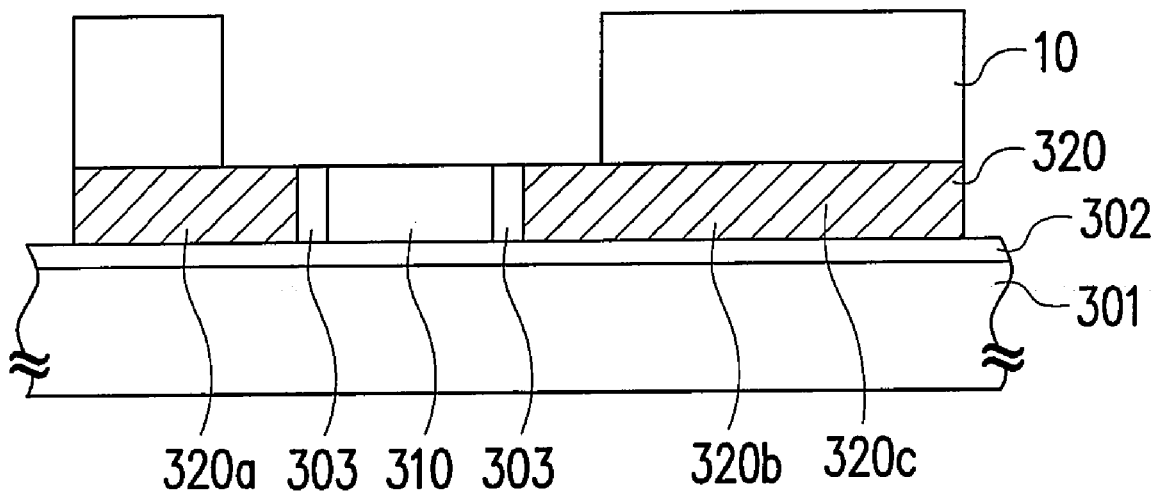

The method for removing the aforementioned metal layer 320 but retaining the metal layer 320 on the respective sides of the patterned polysilicon layer 310 is shown in FIGS. 4A and 4B. First, as shown in FIG. 4A, a photolithographic process is performed to form a photoresist layer 10 on the metal layer 320.

Then, as shown in FIG. 4B, the metal layer 320 is etched using the photoresist layer 10 as a mask so that only part of the metal layer 320 is retained to form the source 320a, the drain 320b and the lower electrode layer 320c. More specifically, in the process of etching the metal layer 320, the thickness of the metal layer 320 to be removed is controlled through setting the time parameter so that etching will stop as soon as the surface of the patterned polysilicon layer 310 is exposed. This prevents any over-etching of the metal layer 320. After that, the photoresist layer 10 is removed.

Figure 5A:
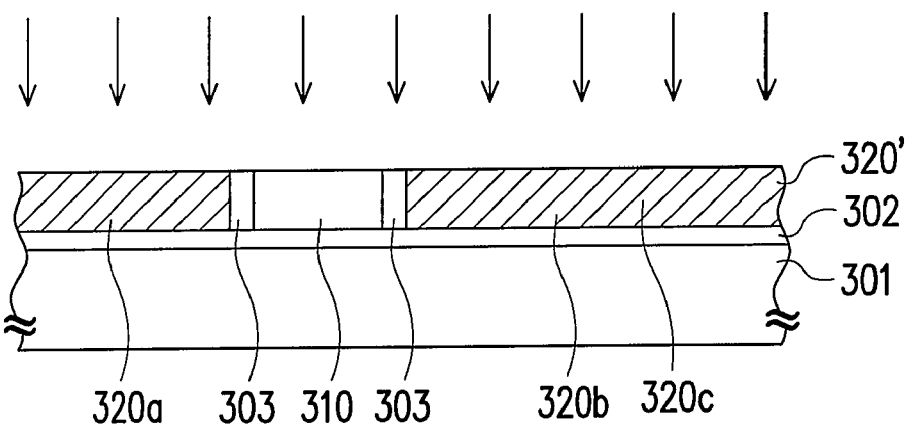
FIGS. 5A through 5C are schematic cross-sectional views showing another set of steps for removing a portion of a metal layer but retaining a portion of the metal layer on the respective sides of the patterned polysilicon layer according to the first embodiment of the present invention.
Figure 5B:
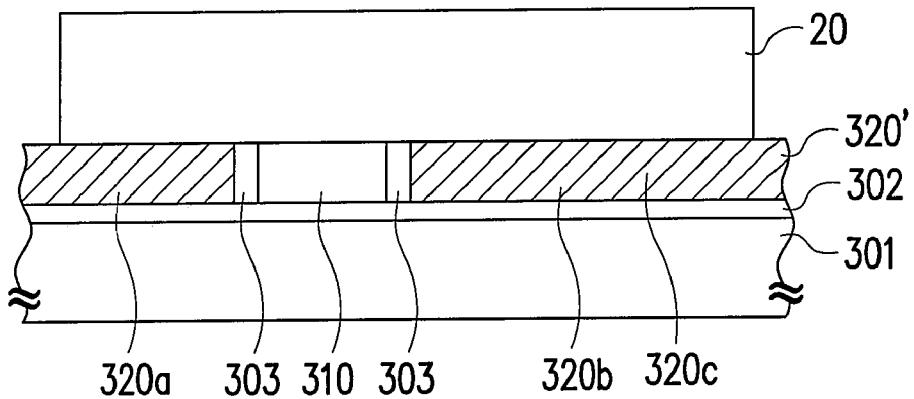
Figure 5C:
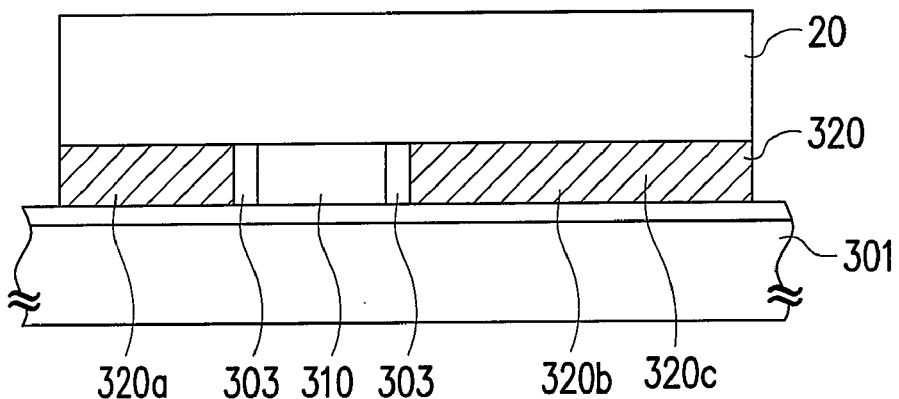

Aside from the foregoing method shown in FIGS. 4A and 4B, a chemical-mechanical polishing (CMP) process followed by a photolithographic process and an etching process can also be used. FIGS. 5A through 5C are schematic cross-sectional views showing another set of steps for removing a portion of a metal layer but retaining a portion of the metal layer on the respective sides of the patterned polysilicon layer according to the first embodiment of the present invention. As shown in FIG. 5A, a chemical-mechanical polishing process on the metal layer 320 is performed so as to form a planar metal layer 320'.

As shown in FIG. 5B, a photolithographic process is performed so that a photoresist layer 20 is formed on the planar metal layer 320'.

As shown in FIG. 5C, the metal layer 320' is etched using the photoresist layer 20 as a mask to form a source 320a, a drain 320b and a lower electrode layer 320. After that, the photoresist layer 20 is removed.

Figure 3E:
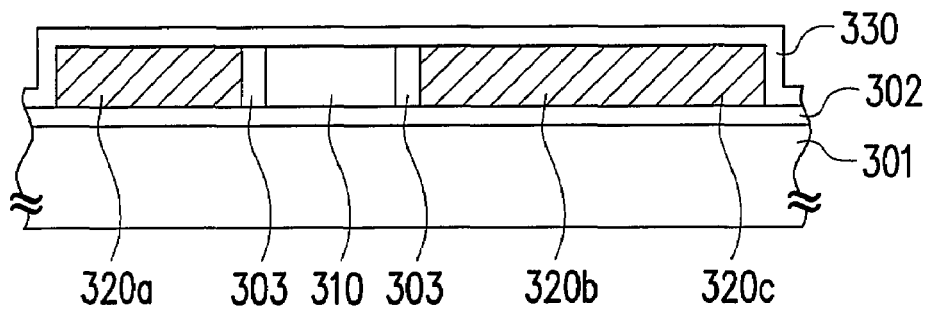

After forming the source 320a, the drain 320b and the lower electrode 320c over the substrate 301, a gate insulation layer 330 is formed over the substrate 301 as shown in FIG. 3E. The gate insulation layer 330 covers the source 320a, the drain 320b, the lower electrode layer 320c, the doped protective wall 303 and the patterned polysilicon layer 310.

Figure 3F:
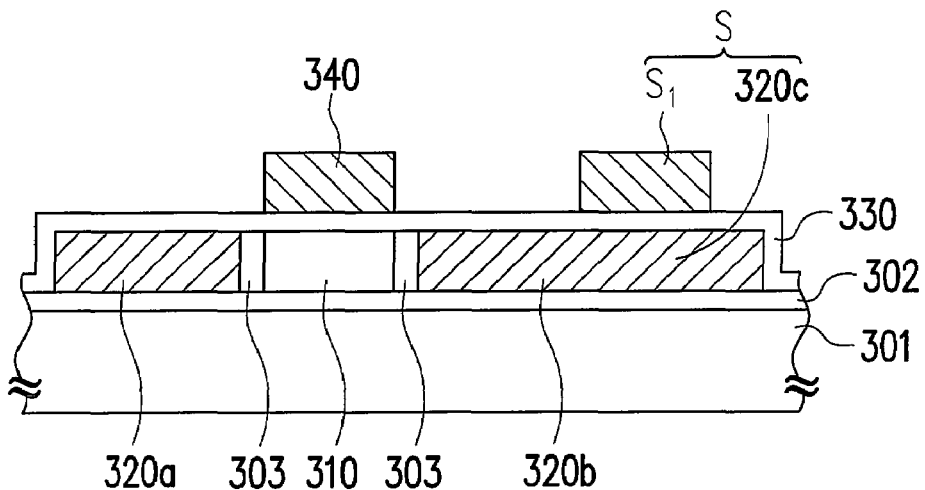

As shown in FIG. 3F, a gate 340 and an upper electrode layer S1 are formed on the gate insulation layer 330. The gate 340 is located above the patterned polysilicon layer 310 and the upper electrode layer S1 is located above the lower electrode layer 320c. In the process of forming the gate 340, a scan line 220 electrically connected to the gate is also simultaneously defined as shown in FIG. 2. The upper electrode layer S1, the lower electrode layer 320c and the gate insulation layer 330 between the upper electrode layer S1 and the lower electrode layer 320c together form a storage capacitor S.

Figure 3G:
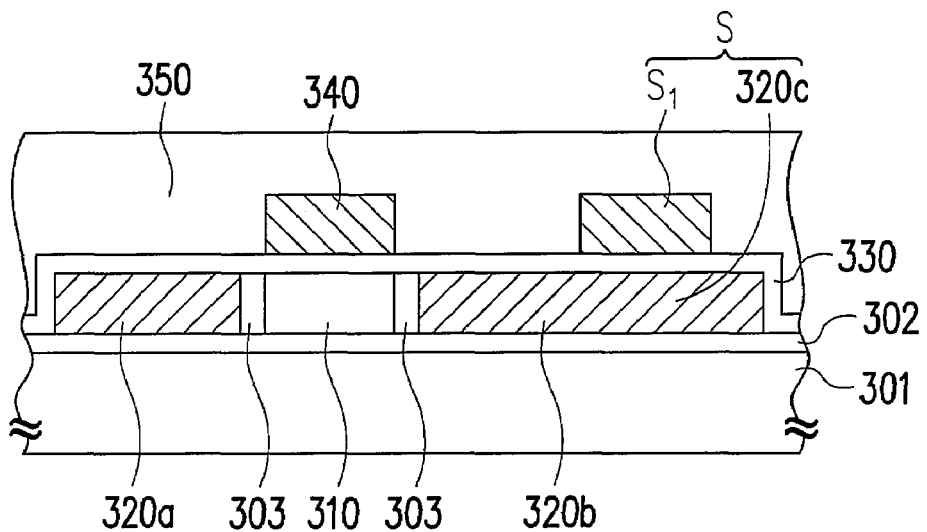
Figure 3H:
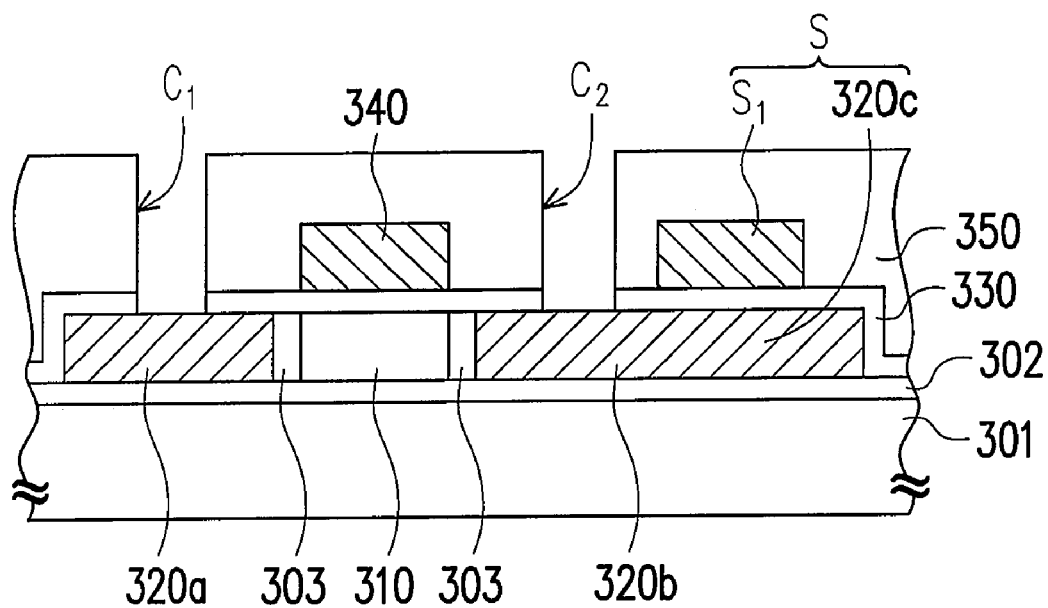

As shown in FIG. 3G, a first dielectric layer 350 is formed over the substrate 301 to cover the gate insulation layer 330, the gate 340 and the upper electrode layer S1. The first dielectric layer 350 is fabricated using silicon nitride, silicon oxide or silicon oxynitride, for example. Then, as shown in FIG. 3H, a first contact opening C1 and a second contact opening C2 are formed in the first dielectric layer 350 and the gate insulation layer 330 to expose the source 320a and the drain 320b respectively.

Figure 3I:
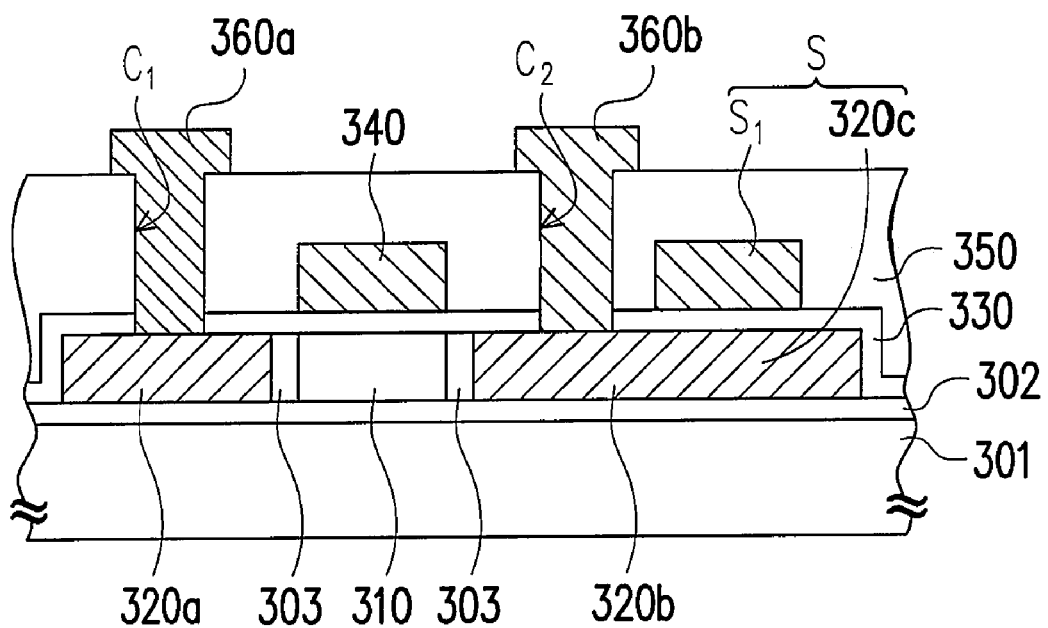

As shown in FIG. 3I, a first metal contact layer 360a and a second metal contact layer 360b are formed over the first dielectric layer 350. The first metal contact layer 360a and the second metal contact layer 360b fill the first contact opening C1 and the second contact opening C2 and electrically connect with the source 320a and the drain 320b respectively.

Figure 3J:
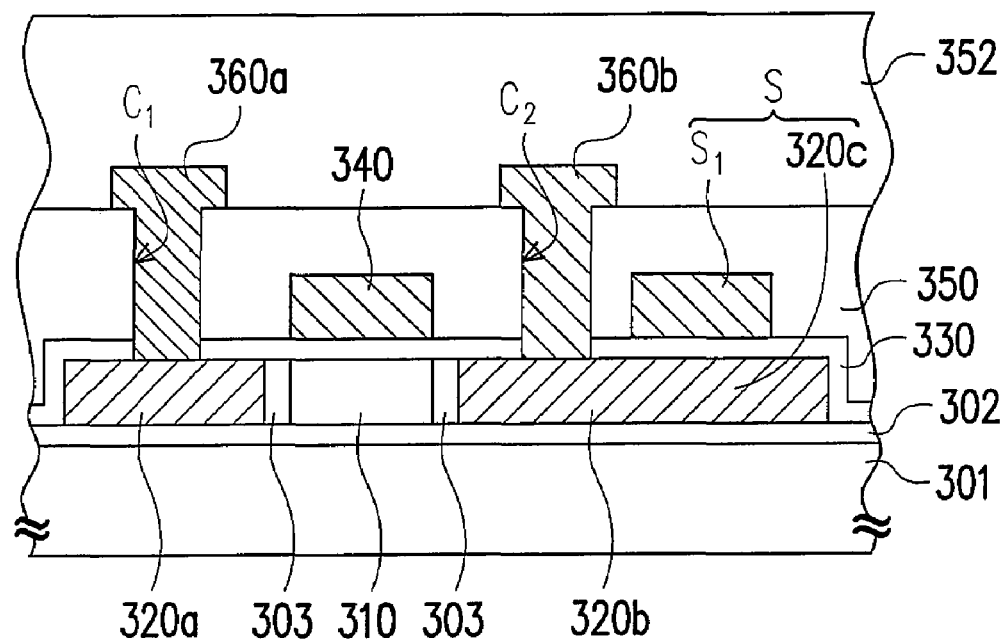

After completing the steps for fabricating the thin film transistor, the process of fabricating the pixel electrode is performed to form a pixel structure. First, as shown in FIG. 3J, a second dielectric layer 352 is formed on the first dielectric layer 350 to cover the first metal contact layer 360a and the second metal contact layer 360b.

Figure 3K:
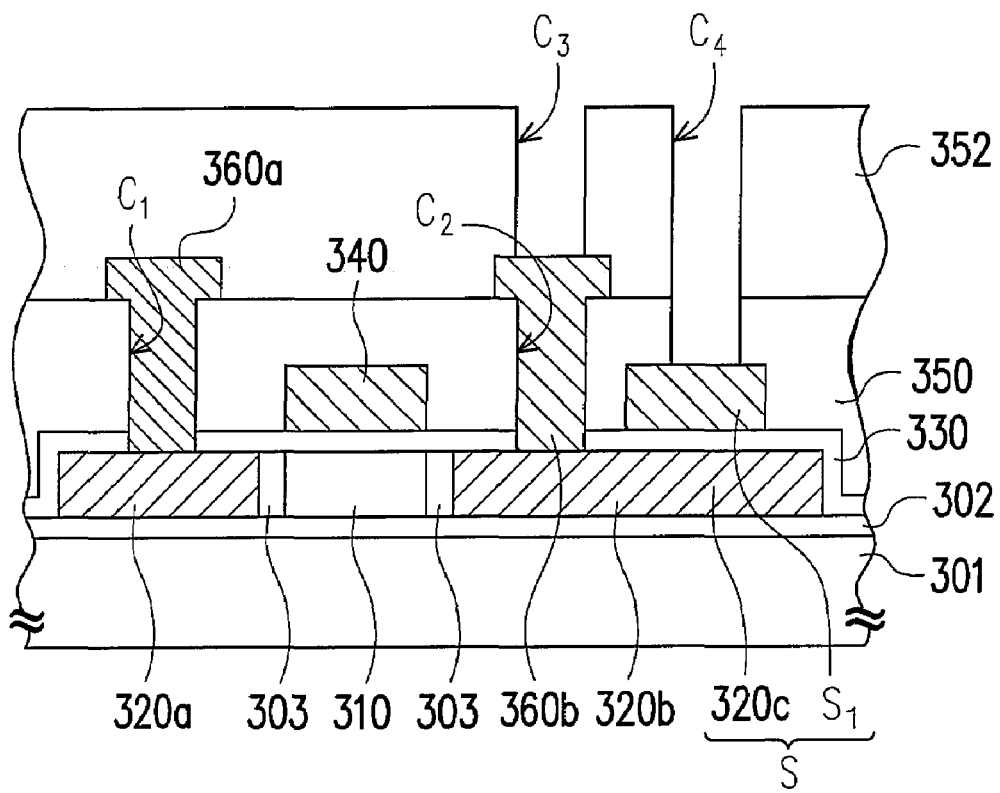

As shown in FIG. 3K, a third contact opening C3 is formed in the second dielectric layer 352 and a fourth contact opening C4 is formed in the first dielectric layer 350 and the second dielectric layer 352. The third contact opening C3 and the fourth contact opening C4 expose the second metal contact layer 360b and the upper electrode layer S1 respectively.

Figure 3L:
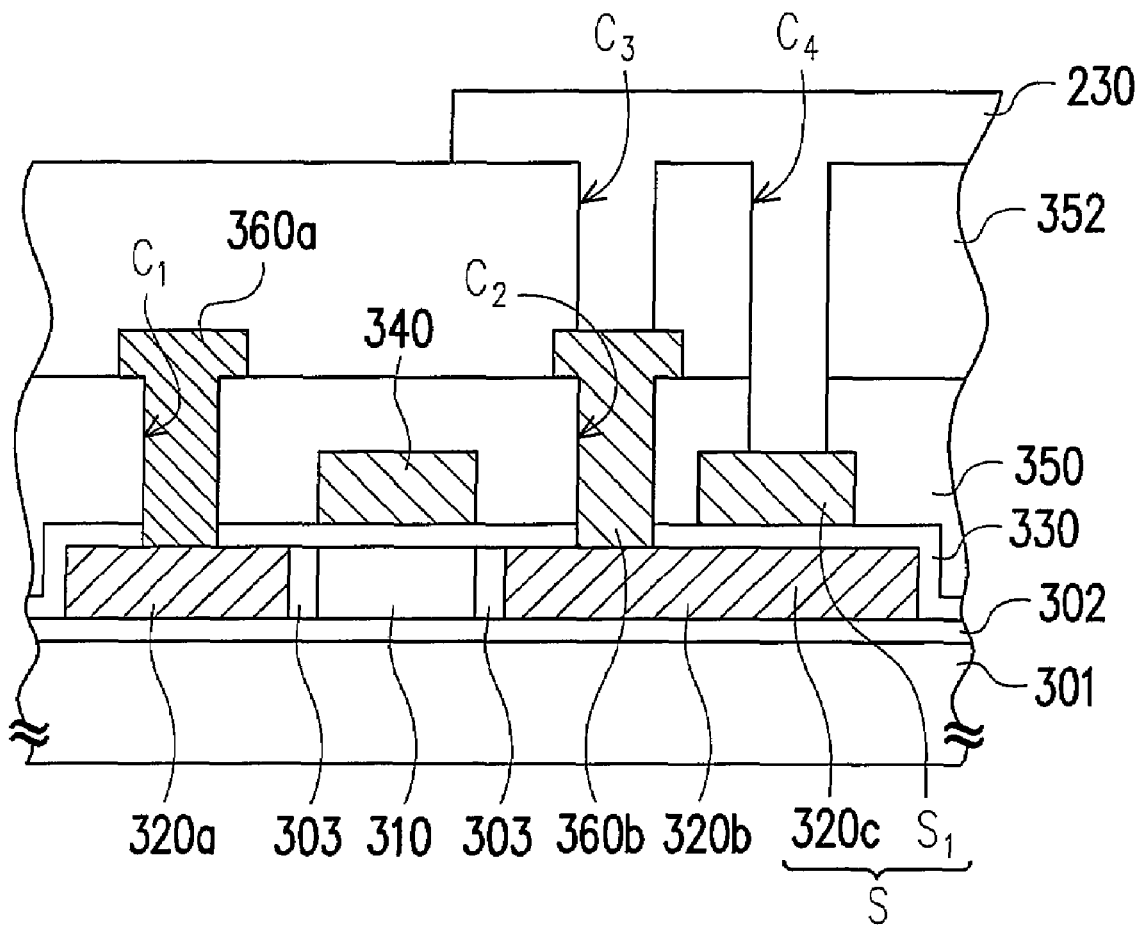

As shown in FIG. 3L, a pixel electrode 230 is formed on the second dielectric layer 352. The pixel electrode 230 fills the third contact opening C3 and the fourth contact opening C4 completely. Therefore, the pixel electrode 230 is electrically connected to the second metal contact layer 360b via the third contact opening C3 so that the pixel electrode 230 is also electrically connected to the drain 320b. Furthermore, the pixel electrode 230 can connect electrically with the upper electrode layer S1 via the fourth contact opening C4. Up to this stage, all the steps necessary for fabricating the pixel structure 200 shown in FIG. 2 have been completed.

FIG. 3I shows a thin film transistor structure fabricated using the method of the present invention. As shown in FIG. 3I, the thin film transistor comprises a patterned polysilicon layer 310, a source 320a, a drain 320b, a gate insulation layer 330, a gate 340, a first dielectric layer 350, a first contact C1, a second contact C2, a first metal contact layer 360a and a second metal contact layer 360b. The patterned polysilicon layer 310 is disposed on a substrate 301. The source 320a and the drain 320b are disposed on the respective sides of the patterned polysilicon layer 310. It should be noted that both the source 320a and the drain 320b are made of metallic material. The gate insulation layer 330 covers the source 320a, the drain 320b and the patterned polysilicon layer 310. The gate 340 is disposed on the gate insulation layer 330 over the patterned polysilicon layer 310.

The foregoing first dielectric layer 350 covers the gate insulation layer 330 and the gate 340. The first contact C1 and the second contact C2 are located in the first dielectric layer 350. The first metal contact layer 360a and the second metal contact layer 360b are disposed on the first dielectric layer 350 and electrically connected to the source 320a and the drain 320b through the first contact C1 and the second contact C2 respectively.

In an embodiment of the present invention, the thin film transistor may further include a doped protective wall 303 disposed between the patterned polysilicon layer 310 and the source 320a and between the patterned polysilicon layer 310 and the drain 320b.

FIGS. 2 and 3L show the pixel structure 200 fabricated using the method of the present invention. The pixel structure 200 mainly comprises a data line 210, a scan line 220, a thin film transistor 300, a first dielectric layer 350, a second dielectric layer 352, a third contact opening C3 and a pixel electrode 230. The data line 210 is electrically connected to the source 320a and the scan line 220 is electrically connected to the gate 340. In addition, the first dielectric layer 350 covers the thin film transistor. The second dielectric layer 352 is disposed over the first dielectric layer 350 to cover the first metal contact layer 360a, the data line 210 and the second metal contact layer 360b. The third contact opening C3 is disposed in the second dielectric layer 352. The pixel electrode 230 fills the third contact opening C3 and electrically connects with the second metal contact layer 360b.

In one preferred embodiment, the foregoing pixel structure 200 may further include a storage capacitor S comprising a lower electrode layer 320c, an upper electrode layer S1 and a gate insulation layer 330 sandwiched between the lower electrode layer 320c and the upper electrode layer S1. Furthermore, the first dielectric layer 350 and the second dielectric layer 352 may further include a fourth contact opening C4 that exposes the upper electrode layer S1. Therefore, the pixel electrode 230 can be connected electrically with the upper electrode layer S1 via the fourth contact opening C4.

Second Embodiment

Figure 6:
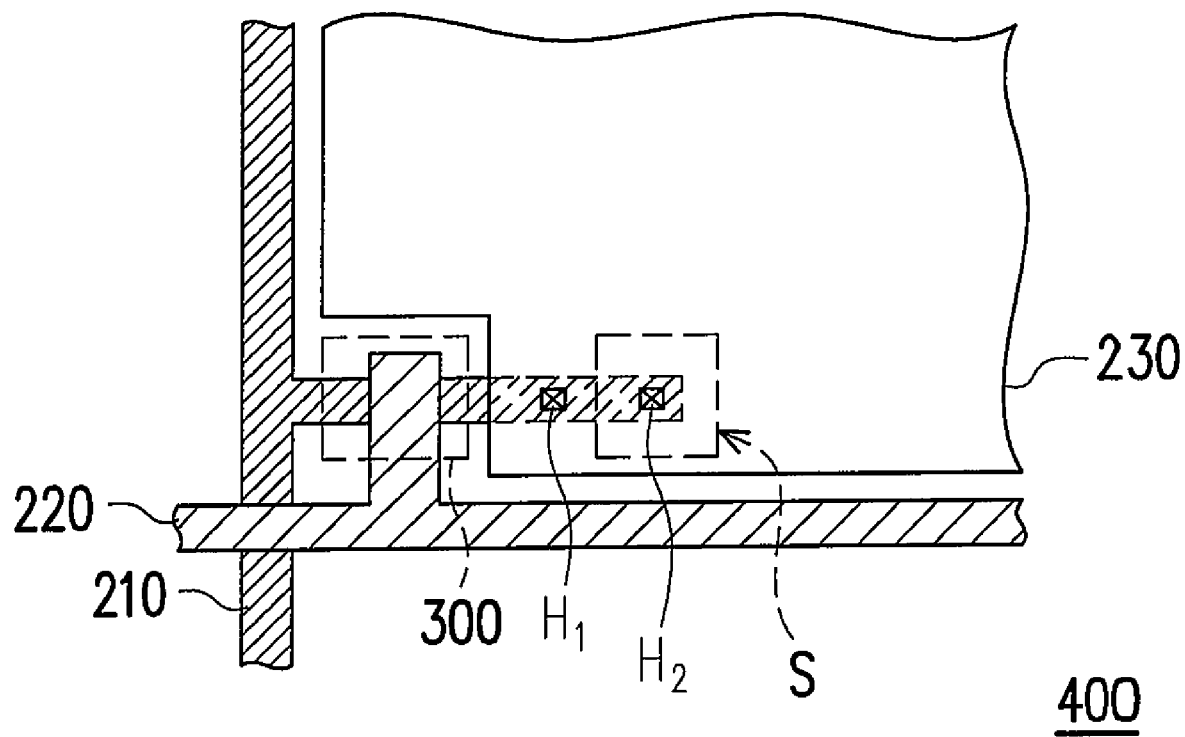
FIG. 6 is a top view of a pixel structure according to the second embodiment of the present invention.

FIG. 6 is a top view of a pixel structure according to the second embodiment of the present invention. The method of fabricating the thin film transistor 300 of the pixel structure 400 includes performing the processes in the first embodiment shown in FIGS. 3A through 3D of the first embodiment. It should be noted that in the step of removing a portion of the metal layer 320 while retaining part of the metal layer 320 on the respective sides of the patterned polysilicon layer 310 to form the source 320a, the drain 320b and the lower electrode 320c shown in FIG. 3D. the second embodiment also includes simultaneously defining a scan line 210 (as shown in FIG. 6) that is connected electrically with the source 320a. Because the source 320a, the drain 320b and the data line 210 are made of metallic material and formed together, the step of fabricating the source/the first metal contact layer can be waived so that the production process is simplified.

The step of removing a portion of the metal layer 320 in the present embodiment may similarly include performing a photolithographic process and an etching process (as shown in FIGS. 4A and 4B). Alternatively, a chemical-mechanical polishing process (as shown in FIGS. 5A through 5C) is performed followed by a photolithographic process and an etching process to form the source 320a, the drain 320b, the lower electrode layer 320c and the data line 210.

The steps for forming the gate insulation layer and the gate are very similar to the ones shown in FIGS. 3E and 3F. More specifically, a gate insulation layer 330 is formed over the substrate to cover the data line 210 (as shown in FIG. 6), the source 320a, the drain 320b, the lower electrode layer 320c and the patterned polysilicon layer 310. Then, a gate 340, an upper electrode layer S1 and a scan line 220 (as shown in FIG. 6) electrically connected to the gate 340 are formed on the gate insulation layer 330 over the patterned polysilicon layer 310.

Figure 7A:
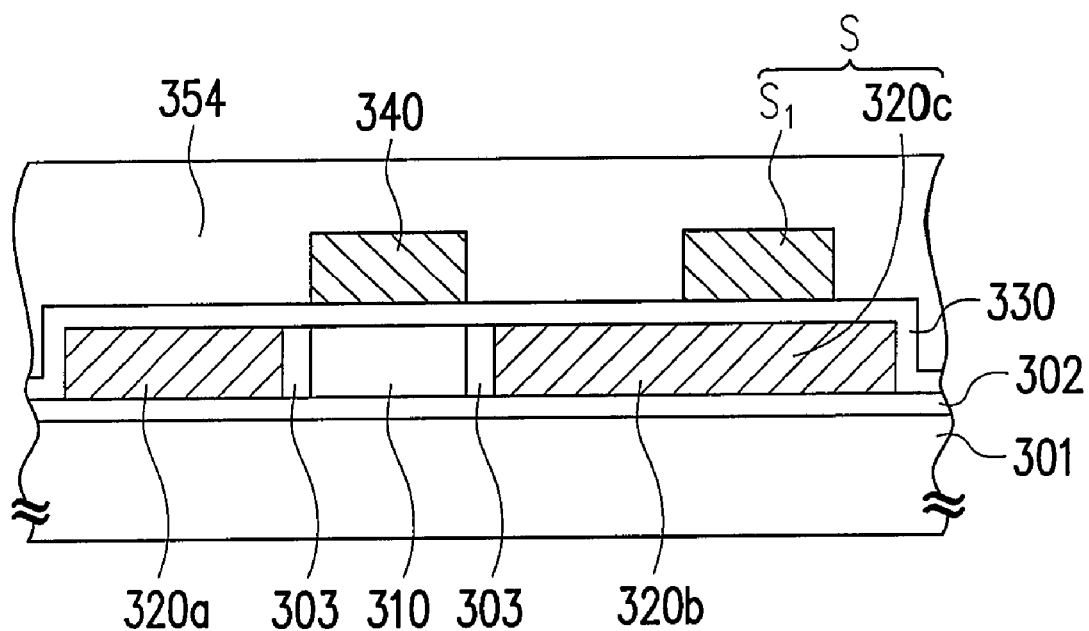
FIGS. 7A through 7C are schematic cross-sectional views showing part of the steps for producing a pixel structure according to the second embodiment of the present invention.
Figure 7B:
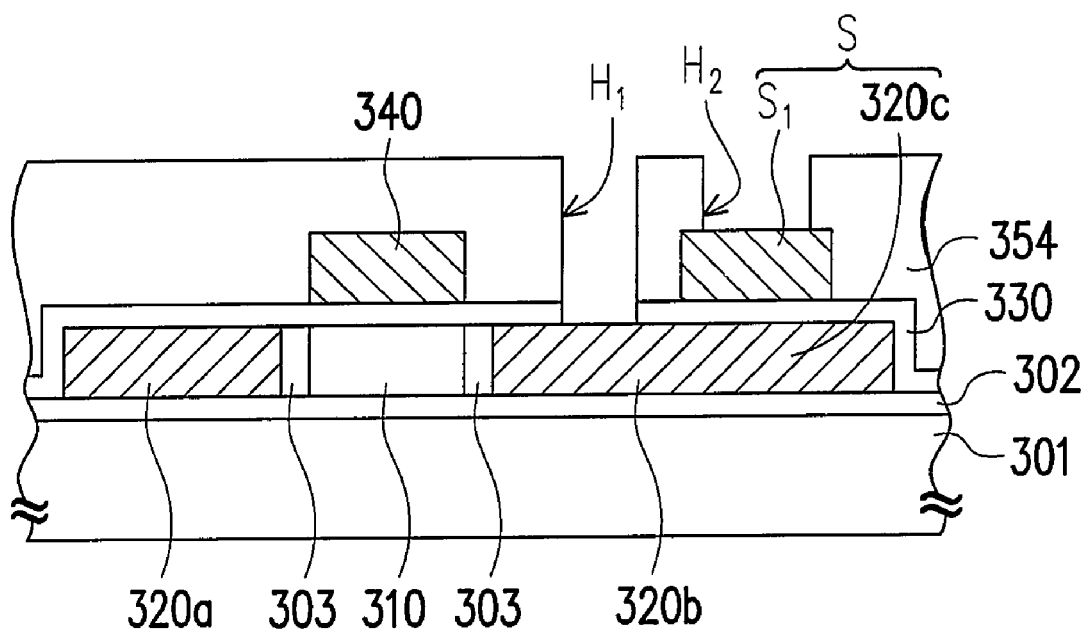
Figure 7C:
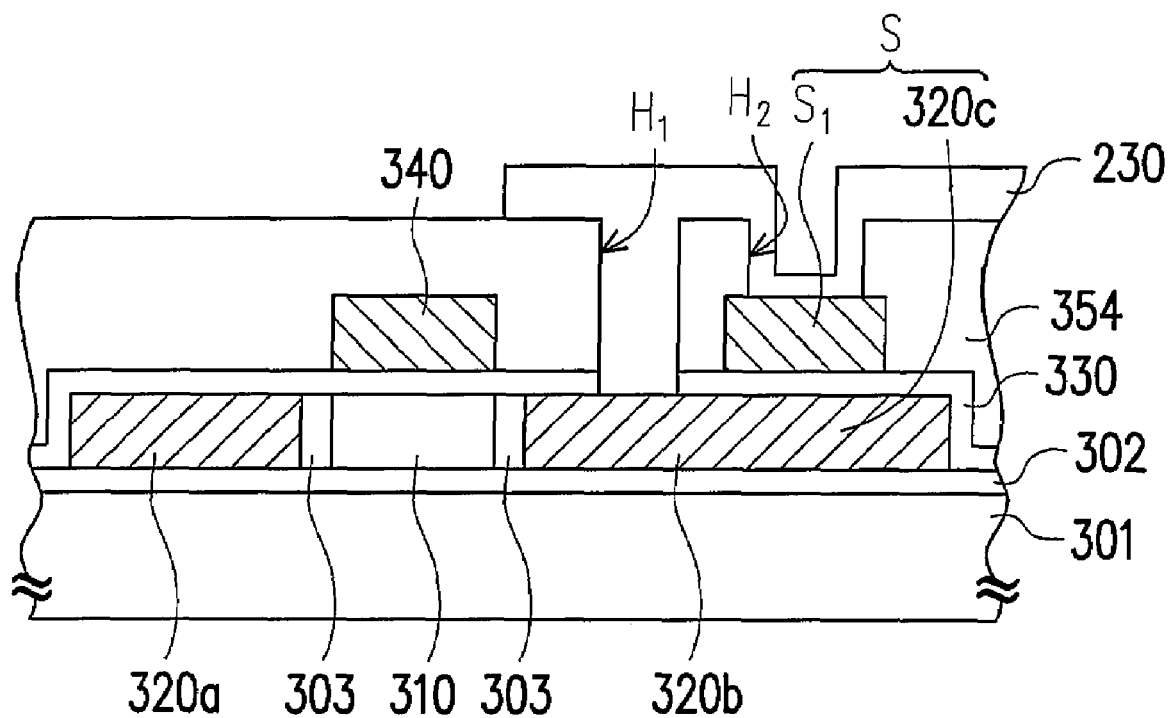

FIGS. 7A through 7C are schematic cross-sectional views showing part of the steps for producing a pixel structure according to a second embodiment of the present invention. First, as shown in FIG. 7A, a first dielectric layer 354 is formed over the substrate 301 to cover the gate 340, the scan line 220 (as shown in FIG. 6) and the metal layer S1. Then, as shown in FIG. 7B, contact openings H1 and H2 are formed in the first dielectric layer 354 and the gate insulation layer 330 to expose the drain 320b and the upper electrode layer S1 respectively.

As shown in FIG. 7C, a pixel electrode 230 is formed on the first dielectric layer 354. The pixel electrode 230 fills the contact openings H1 and H2 and electrically connects with the drain 320b and the upper electrode layer S1 respectively. The pixel electrode 230 is fabricated using indium tin oxide or indium zinc oxide, for example.

FIGS. 6 and 7C show the pixel structure 400 according to the present embodiment. The pixel structure 400 mainly comprises a data line 210, a scan line 220, a pixel electrode 230, a patterned polysilicon layer 310, a source 320a, a drain 320b, a gate insulation layer 330, a gate 340, a first dielectric layer 354 and a contact opening H1. The patterned polysilicon layer 310 is disposed on a substrate 301. The source 320a, the drain 320b and the lower electrode layer 320c are disposed on the respective sides of the patterned polysilicon layer 310. Furthermore, the source 320a, the drain 320b and the data line 210 are all made of metallic material. The data line 210 and the source 320a are electrically connected. The gate insulation layer 330 covers the data line 210, the patterned polysilicon layer 310, the source 320a and the drain 320b.

The gate 340 is disposed on the gate insulation layer 330 above the patterned polysilicon layer 310. The scan line 220 is electrically connected to the gate 340. The first dielectric layer 354 covers the gate 340 and the scan line 220. The contact opening H1 is disposed in the first dielectric layer 354 and the gate insulation layer 330 to expose the drain 320b. The pixel electrode 230 is disposed on the first dielectric layer 354. The pixel electrode 230 fills the contact opening H1 to connect electrically with the drain 320b.

In one preferred embodiment, the foregoing pixel structure 200 may further include a storage capacitor S comprising a lower electrode layer 320c, an upper electrode layer S1 and a gate insulation layer 330 sandwiched between the lower electrode layer 320c and the upper electrode layer S1. In addition, the first dielectric layer 354 may further include a contact opening H2 disposed therein that exposes the upper electrode layer S1. Therefore, the pixel electrode 230 can connect electrically with the upper electrode layer S1 via the contact opening H2.

In another preferred embodiment, the pixel structure 400 may further include a doped protective wall 303 disposed between the patterned polysilicon layer 310 and the source 320a and the drain 320b.

In summary, the pixel structure and the thin film transistor structure and fabrication method thereof in the present invention have at least the following advantages:

1. The method of forming a thin film transistor produces a source and a drain made of metallic material so that the process of fabricating the source and the drain does not require using an ion implant machine or performing an annealing process. Hence, the thin film transistor can be produced in shorter time and at lower cost.

2. The source, the drain and the data line in the pixel structure are fabricated
using a metallic material simultaneously so that resistor-capacitor delay in the pixel structure can be substantially reduced. Moreover, the processing time is also shortened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
a patterned polysilicon layer disposed on a substrate;
a source and a drain disposed on the respective sides of the patterned polysilicon layer, wherein the source and the drain are made of metallic material;
a data line disposed on the substrate and electrically connected to the source;
a gate insulation layer disposed on the substrate covering the data line, the source, the drain and the patterned polysilicon layer;
a gate disposed on the gate insulation layer over the patterned polysilicon layer;
a scan line disposed on the gate insulation layer and electrically connected to the gate;
a first dielectric layer covering the gate and the scan line; and
a pixel electrode disposed on the first dielectric layer and electrically connected to the drain.

2. The pixel structure of claim 1, further comprising a doped protective wall disposed between the patterned polysilicon layer and the source and between the patterned polysilicon layer and drain respectively.

3. A pixel structure, comprising:
a patterned polysilicon layer disposed on a substrate;
a source and a drain disposed over the substrate on the respective sides of the patterned polysilicon layer, wherein the source and the drain are made of metallic material;
a data line disposed over the substrate and electrically connected to the source;

a gate insulation layer covering the source, the drain and the patterned polysilicon layer;

a gate disposed on the gate insulation layer;

a scan line disposed on the gate insulation layer and electrically connected to the gate;

a first dielectric layer disposed over the gate and the scan line;

a first metal contact layer and a second metal contact layer disposed over the first dielectric layer and electrically connected to the source and the drain respectively;

a second dielectric layer disposed on the first dielectric layer to cover the first metal contact layer and the second metal contact layer; and a pixel electrode disposed on the second dielectric layer and electrically connected to the second metal contact layer.

4. The pixel structure of claim 3, further comprising a doped protective wall disposed between the patterned polysilicon layer and the source and between the patterned polysilicon layer and drain respectively.

* * * * *